US009317636B1

(12) United States Patent
Petras et al.

(10) Patent No.: US 9,317,636 B1
(45) Date of Patent: Apr. 19, 2016

(54) SYSTEM AND METHOD FOR STOPPING INTEGRATED CIRCUIT SIMULATION

(75) Inventors: Dietmar Petras, Langerwehe (DE); Niels Vanspauwen, Heverlee (BE)

(73) Assignee: Synopsys, Inc., Mountain View, CA (US)

( * ) Notice: Subject to any disclaimer, the term of this patent is extended or adjusted under 35 U.S.C. 154(b) by 1115 days.

(21) Appl. No.: 11/637,374

(22) Filed: Dec. 11, 2006

(51) Int. Cl.
  *G06F 17/50* (2006.01)
  *G06F 11/26* (2006.01)

(52) U.S. Cl.
  CPC ........ *G06F 17/5022* (2013.01); *G06F 11/261* (2013.01)

(58) Field of Classification Search
  CPC ............. G06F 11/3664; G06F 11/362; G06F 11/3632; G06F 17/5022
  USPC .......... 714/14, 35; 717/129, 134, 135; 703/17
  See application file for complete search history.

(56) References Cited

U.S. PATENT DOCUMENTS

| | | | | |
|---|---|---|---|---|
| 4,819,234 A * | 4/1989 | Huber | ........................ | 717/129 |
| 5,048,018 A * | 9/1991 | Bernstein et al. | ............. | 717/131 |
| 5,146,460 A | 9/1992 | Ackerman et al. | | |
| 5,321,828 A * | 6/1994 | Phillips et al. | ................. | 703/28 |
| 5,493,672 A * | 2/1996 | Lau et al. | ....................... | 703/21 |
| 5,533,192 A * | 7/1996 | Hawley et al. | ................. | 714/28 |
| 5,548,717 A * | 8/1996 | Wooldridge et al. | ......... | 717/124 |
| 5,732,247 A * | 3/1998 | Dearth et al. | .................. | 703/13 |
| 5,784,593 A * | 7/1998 | Tseng et al. | .................... | 703/15 |
| 5,787,245 A * | 7/1998 | You et al. | .................... | 714/38.13 |
| 5,796,946 A * | 8/1998 | Sakon | ............................. | 709/248 |
| 5,805,867 A * | 9/1998 | Kodaira | ........................... | 703/21 |
| 5,937,179 A * | 8/1999 | Swoboda | ........................... | 716/16 |
| 6,014,512 A * | 1/2000 | Mohamed et al. | .............. | 703/27 |
| 6,026,230 A | 2/2000 | Lin et al. | | |
| 6,058,393 A | 5/2000 | Meier et al. | | |
| 6,230,114 B1 | 5/2001 | Hellestrand et al. | | |
| 6,285,974 B1 * | 9/2001 | Mandyam et al. | .............. | 703/13 |
| 6,324,683 B1 | 11/2001 | Fuh et al. | | |
| 6,378,124 B1 * | 4/2002 | Bates et al. | .................... | 717/129 |
| 6,389,379 B1 | 5/2002 | Lin et al. | | |
| 6,543,049 B1 * | 4/2003 | Bates et al. | .................... | 717/129 |
| 6,598,181 B1 * | 7/2003 | Pennell | ...................... | 714/38.14 |
| 6,681,384 B1 * | 1/2004 | Bates et al. | .................... | 717/129 |
| 6,708,326 B1 * | 3/2004 | Bhattacarya | .................. | 717/124 |
| 6,718,294 B1 * | 4/2004 | Bortfeld | .......................... | 703/20 |
| 6,751,583 B1 | 6/2004 | Clarke et al. | | |
| 6,823,518 B1 * | 11/2004 | Bliss et al. | ..................... | 719/310 |
| 6,862,694 B1 * | 3/2005 | Tormey et al. | .................. | 714/34 |

(Continued)

FOREIGN PATENT DOCUMENTS

JP      06075820 A  *  3/1994  ............. G06F 11/28

OTHER PUBLICATIONS

Bedichek, Robert. "Talisman: Fast and Accurate Multicomputer Simulation" ACM 1995, pp. 14-24.*

(Continued)

*Primary Examiner* — Akash Saxena
(74) *Attorney, Agent, or Firm* — Fenwick & West LLP (57) ABSTRACT

A system for simulating hardware is disclosed wherein stopping the simulating for investigating a state of the simulating is constrained to occur at points of simulation synchronization. A delta cycle may be inserted into a simulation to provide a point of simulation synchronization. The delta cycle may be inserted at the beginning of a simulation loop.

20 Claims, 4 Drawing Sheets

(56) References Cited

U.S. PATENT DOCUMENTS

| | | | |
|---|---|---|---|
| 6,868,454 B1 | 3/2005 | Kubota et al. | |
| 6,892,324 B1 | 5/2005 | French et al. | |
| 6,961,926 B2 | 11/2005 | Koyama | |
| 6,990,657 B2* | 1/2006 | Hunter et al. | 717/129 |
| 7,107,578 B1 | 9/2006 | Alpern | |
| 7,124,404 B1* | 10/2006 | Bebout et al. | 717/127 |
| 7,331,002 B2* | 2/2008 | Rivard et al. | 714/35 |
| 7,480,825 B2 | 1/2009 | Vorbach | |
| 7,599,821 B1* | 10/2009 | Hou et al. | 703/2 |
| 7,698,118 B2* | 4/2010 | Reblewski | 703/13 |
| 7,711,535 B1* | 5/2010 | Brookes et al. | 703/14 |
| 7,742,905 B2* | 6/2010 | Vanspauwen et al. | 703/13 |
| 7,849,450 B1 | 12/2010 | Rydh et al. | |
| 7,941,788 B2* | 5/2011 | Browning et al. | 717/124 |
| 7,984,304 B1 | 7/2011 | Waldspurger et al. | |
| 2001/0021985 A1 | 9/2001 | Aldridge et al. | |
| 2002/0032559 A1 | 3/2002 | Helfestrand et al. | |
| 2002/0049576 A1* | 4/2002 | Meyer | 703/14 |
| 2002/0059542 A1 | 5/2002 | Debling | |
| 2002/0100021 A1* | 7/2002 | Hunter et al. | 717/124 |
| 2002/0100024 A1* | 7/2002 | Hunter et al. | 717/129 |
| 2002/0104071 A1 | 8/2002 | Charisius et al. | |
| 2002/0133325 A1* | 9/2002 | Hoare et al. | 703/17 |
| 2002/0162051 A1* | 10/2002 | Bolding et al. | 714/34 |
| 2002/0199173 A1* | 12/2002 | Bowen | 717/129 |
| 2003/0037317 A1 | 2/2003 | Emberson | |
| 2003/0061542 A1* | 3/2003 | Bates et al. | 714/38 |
| 2003/0074177 A1 | 4/2003 | Bowen | |
| 2003/0097613 A1 | 5/2003 | Kageshima | |
| 2003/0149961 A1* | 8/2003 | Kawai et al. | 717/129 |
| 2004/0250244 A1 | 12/2004 | Albrecht | |
| 2005/0010880 A1 | 1/2005 | Schubert et al. | |
| 2005/0144585 A1* | 6/2005 | Daw et al. | 716/18 |
| 2005/0229163 A1* | 10/2005 | Bates et al. | 717/129 |
| 2005/0283674 A1* | 12/2005 | Rivard et al. | 714/34 |
| 2005/0289396 A1* | 12/2005 | Hooper et al. | 714/34 |
| 2006/0090136 A1 | 4/2006 | Miller et al. | |
| 2006/0195822 A1 | 8/2006 | Beardslee et al. | |
| 2006/0195825 A1* | 8/2006 | Vanspauwen et al. | 717/135 |
| 2006/0206873 A1 | 9/2006 | Argade | |
| 2006/0253842 A1 | 11/2006 | Pees et al. | |
| 2007/0240123 A1* | 10/2007 | Bustelo et al. | 717/129 |
| 2008/0141222 A1 | 6/2008 | Alpern | |
| 2009/0132991 A1* | 5/2009 | Ganai et al. | 716/18 |
| 2010/0251217 A1 | 9/2010 | Miller | |
| 2011/0307233 A1 | 12/2011 | Tseng et al. | |

OTHER PUBLICATIONS

Carson II, J.S., "Introduction to Modeling and Simulation," Proceedings of the 2004 Winter Simulation Conference, Dec. 5, 2004, 8 pages.

Quaglia, F., "A Cost Model for Selecting Checkpoint Positions in Time Warp Parallel Simulation," IEEE Transactions on Parallel and Distributed Systems, Apr. 2001, pp. 346-362, vol. 12, No. 4.

* cited by examiner

SYSTEM AND METHOD FOR STOPPING INTEGRATED CIRCUIT SIMULATION

FIELD OF INVENTION

Embodiments of the present invention relate to the field of integrated circuit design. More specifically, embodiments of the present invention relate to systems and methods for stopping integrated circuit simulation.

BACKGROUND

It is generally desirable to simulate operations of a hardware system, e.g., an integrated circuit, prior to actually constructing such a system. Simulation is widely used during the development of integrated circuits. One benefit of such simulation may be the detection of design errors in a period, e.g., prior to fabrication, that allows for rapid and low cost resolution of such errors.

A second benefit of simulation is found in enabling the development of a wide variety of tools intended to be utilized with the finished hardware. For example, if an integrated circuit comprises a processor, e.g., a stored program computer, the use of simulation may enable the development of software tools, e.g., compliers for high level programming languages, to begin prior to the completion and availability of the integrated circuit. Such tools may then be advantageously made available earlier than if their development was delayed until the integrated circuit was available.

A third benefit of simulation enables the simulated execution of software intended for use on or with the system. Such simulated execution of target software may identify opportunities for optimization of the hardware design at a point in time that allows for design changes that incorporate such optimizations.

Most simulation systems comprise an investigative agent that allows a user to temporarily suspend the simulation in order to investigate or query the state of the simulated hardware and/or software "running" on the simulated hardware. Such investigative agents are frequently known as or referred to as "debuggers," and are commonly utilized in a simulation process. An investigative agent or debugger typically interrupts simulation, e.g., at a particular clock cycle or a software breakpoint. A user is then able to observe various hardware and/or software states within the simulation.

It is becoming increasingly common for hardware systems, including integrated circuits, to comprise multiple processor instances. For example, many mobile phones utilize a single integrated circuit that comprises both a digital signal processor (DSP) and a general purpose processor or central processing unit (CPU). In addition, "multi-core" general purpose processors are available. The operation of such multiple processors is frequently closely coupled, and it is therefore highly desirable to simulate the operation of such multiple processors together. It is appreciated that it is often desirable to simulate the operation of non-processor hardware as well, e.g., together with one or more processors.

Under the conventional simulation art, in general, simulation is performed in a sequential manner. For example, in simulating a two-processor system, the actions and events, e.g., executing an instruction, of one processor are simulated, and then the actions and events of the other processor are simulated. It is appreciated that such a simulation occurs sequentially, e.g., first one and then the other, even though the actual target operation may involve parallel operations, e.g., the actions of both processors are to occur at the same time (within the target hardware).

Unfortunately, this sequential nature of simulation usually results in an inconsistent simulated hardware state at any single point in the simulation. For example, an investigative agent may stop a simulation subsequent to the simulation of a first hardware module, e.g., a first processor, but prior to the simulation of a second hardware module, e.g., a second processor. As a deleterious result, the hardware state of one module does not correspond to the hardware state of another module during an investigation. Thus, the value of simulating a system comprising multiple modules is diminished.

SUMMARY OF THE INVENTION

Therefore, what is needed is a system and method for stopping integrated circuit simulation. What is additionally needed is a system and method for stopping integrated circuit simulation that stops a simulation in a consistent state for all simulated modules. A further need exists for systems and methods for stopping integrated circuit simulation that are compatible and complementary with existing systems and methods of hardware and processor simulation. Embodiments of the present invention provide these advantages.

Accordingly, in one embodiment, a system for simulating hardware is disclosed wherein stopping the simulating for investigating a state of the simulating is constrained to occur at points of simulation synchronization. A delta cycle may be inserted into a simulation to provide a point of simulation synchronization. The delta cycle may be inserted at the beginning of a simulation loop.

In accordance with an alternative embodiment of the present invention, a SystemC simulation is suspended at a point during execution at which all modules of the SystemC model are synchronized. For example, simulation is suspended at a point during execution at which all behavior code of all modules belonging to a given SystemC time have been executed. The exact SystemC time when the simulation stops is determined in such a way that an instruction state simulator is enabled to request suspension of the SystemC simulation at the beginning of the clock cycle that executes an instruction with a breakpoint.

In accordance with another embodiment of the present invention, a method is disclosed comprising stopping a hardware simulation at a point of synchronization of the hardware simulation. An investigative agent, e.g., a debugger, may be executed responsive to the stopping. A central application software for the hardware simulation may receive all requests for stopping the hardware simulation, and may maintain a list of active requests for stopping the hardware simulation.

In accordance with yet another embodiment of the present invention, a data structure contained in computer usable memory is disclosed for determining the existence of a request to stop a hardware simulation.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Reference will now be made in detail to various embodiments of the invention, a reusable image bearing surface and method of modifying memory contents related to same, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., process 300) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "stopping" or "suspending" or "receiving" or "adding" or "removing" or "executing" or "continuing" or "indexing" or "processing" or "computing" or "translating" or "calculating" or "determining" or "scrolling" or "displaying" or "recognizing" or "generating" or "changing" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The term "delta cycle" is a well known term of art among those of ordinary skill in the simulation arts that is generally used to refer to the smallest increment of simulation. Delta cycles are generally considered to be orthogonal to simulation time. For example, a variable number of delta cycles may need to complete for any particular increment of simulation time.

System and Method of Stopping Integrated Circuit Simulation

Figure 1:
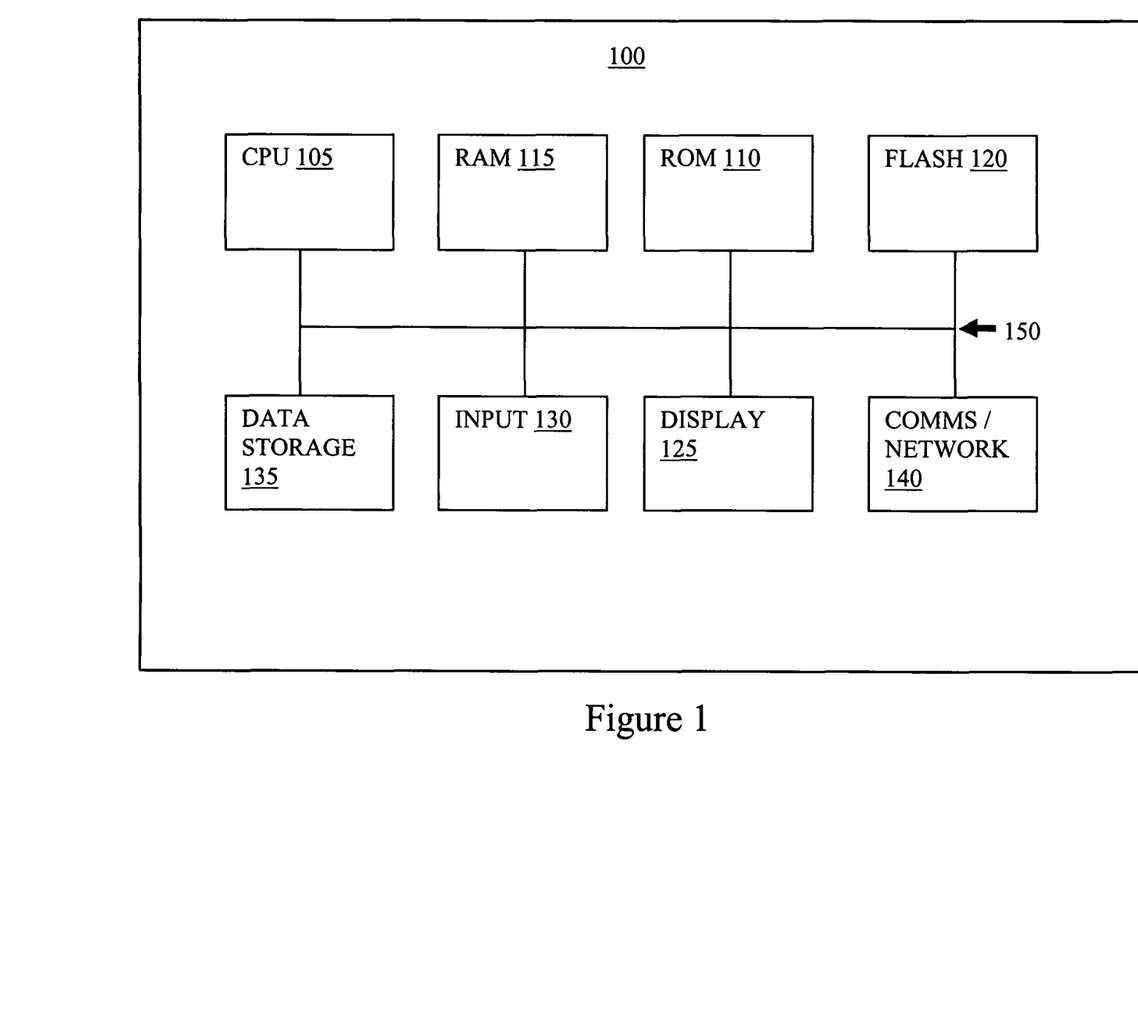
FIG. 1 illustrates circuitry of computer system, which may form a platform for the implementation of embodiments in accordance with the present invention.

FIG. 1 illustrates circuitry of computer system 100, which may form a platform for the implementation of embodiments in accordance with the present invention. For example, a simulation may be seen as a complex computer data structure and program running on computer system 100.

Computer system 100 includes an address/data bus 150 for communicating information, a central processor 105 functionally coupled with the bus for processing information and instructions, a volatile memory 115 (e.g., random access memory RAM) coupled with the bus 150 for storing information and instructions for the central processor 105 and a non-volatile memory 110 (e.g., read only memory ROM) coupled with the bus 150 for storing static information and instructions for the processor 105. Computer system 100 also optionally includes a changeable, non-volatile memory 120 (e.g., flash) for storing information and instructions for the central processor 105, which can be updated after the manufacture of system 100.

Computer system 100 also optionally includes a data storage device 135 (e.g., a rotating magnetic disk) coupled with the bus 150 for storing information and instructions.

Also included in computer system 100 of FIG. 1 is an optional alphanumeric input device 130. Device 130 can communicate information and command selections to the central processor 100. Device 130 may take the form of a touch sensitive digitizer panel or typewriter-style keyboard. Display device 125 utilized with the computer system 100 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user. Optional signal input/output communication device 140 is also coupled to bus 150. Device 140 may be a network interface card configured for various well known networks, either for the local area or for longer distances, including without limitation ethernet and token ring.

In many simulation systems, the execution of instructions by a processor core may be modeled by an instruction set simulator (ISS). An ISS models the execution of software for the modeled processor. Debugging of a software image for the ISS is generally performed in the same manner as debugging of software on actual hardware. For example, a debugger program is another program running on the same computer as the simulation, or running on another computer and communicating to the simulation by a network connection. The debugger program coordinates and communicates with the simulation in order to debug the software executed on the ISS. The ISS is the debugging target of the debugger.

A basic task of a software debugger program is to control the run mode of the instruction set simulator. For example, a typical debugger program is able to stop a simulation, continue a simulation, suspend or stop an ISS, continue an ISS, single step an ISS, or the like. A typical debugger program is able to control breakpoints in an ISS that stop simulation under specific conditions, e.g., responsive to execution of an instruction at a particular memory address. Suspending an ISS generally refers to temporarily stopping a simulation in a state that enables the debugger to investigate and modify the state of the ISS or other components in the simulation model.

Figure 2:
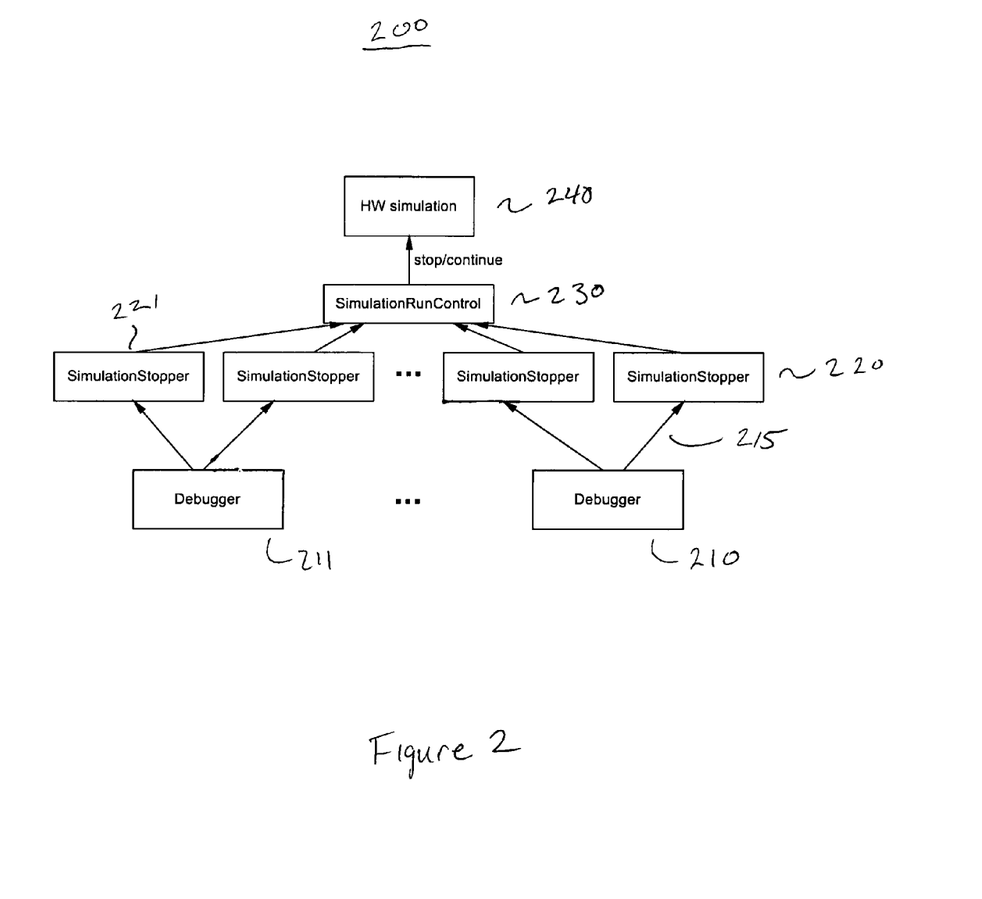
FIG. 2 illustrates a block diagram of simulation software, in accordance with embodiments of the present invention.

FIG. 2 illustrates a block diagram of simulation software 200, in accordance with embodiments of the present invention. Simulation software 200 may operate on computer system 100, for example. Simulation software 200 comprises a plurality of debugger software 210, 211. Debugger software 210, 211 provides a user investigative access to a simulation. Debugger software 210, 211 may correspond to different hardware modules involved in a simulation. For example, debugger software 210 may correspond to a first processor being simulated, and debugger software 211 may correspond to a second processor being simulated. Alternatively, and in accordance with embodiments of the present invention, debugger software 210 or 211 may correspond to an investigative agent used to examine a state of non-processor hardware being simulated.

In contrast to the conventional art, debugger software 210, 211, does not directly control the run mode of an instruction set simulator. Rather, in accordance with embodiments of the present invention, debugger software 210, 211 communicates a simulation control request, e.g., simulation stop request 215, to a simulation stopper software, e.g., simulation stopper software 220.

Simulation software 200 further comprises a simulation run control software 230. Simulation run control software 230 may be implemented as a central appliance belonging to the simulation environment. Simulation run control software 230 is responsible for stopping and continuing simulation. Simulation run control software 230 responds to a request, e.g., to stop simulation, from a simulation stopper, e.g., simulation stopper software 220. In response to such a request, simulation run control software 230 will signal the hardware simulation 240 to stop only at particular points of synchronization.

There may be a plurality of simulation stopper software, e.g., simulation stopper software 220, 221. Each instance of simulation stopper software functions independently of any other instances. In response to a simulation control request, e.g., simulation stop request 215, a simulation stopper software may send a request to simulation run control software 230 that simulation be stopped, e.g., interrupted or suspended. A simulation stopper making a request to stop the simulation is identified as an active simulation stopper. If an active simulation stopper requests continuation of the simulation it becomes inactive.

The simulation run control software 230 maintains a list, e.g., in computer usable storage, of active simulation stoppers. This list is further described with respect to FIGS. 3 and 4, below. When this list is empty, e.g., all simulation stoppers are inactive, the next request by a simulation stopper to stop the simulation activates the simulation run control and requests that the simulation be stopped at a point of hardware state simulation synchronization. For example, such a synchronization point may occur during the next advance of the simulation time between a first and second delta cycles. The simulation remains stopped while the list of active simulation stoppers kept by the simulation run control 230 is not empty. For example, the simulation continues when the last active simulation stopper requests continuation of the simulation and becomes inactive.

Figure 3:
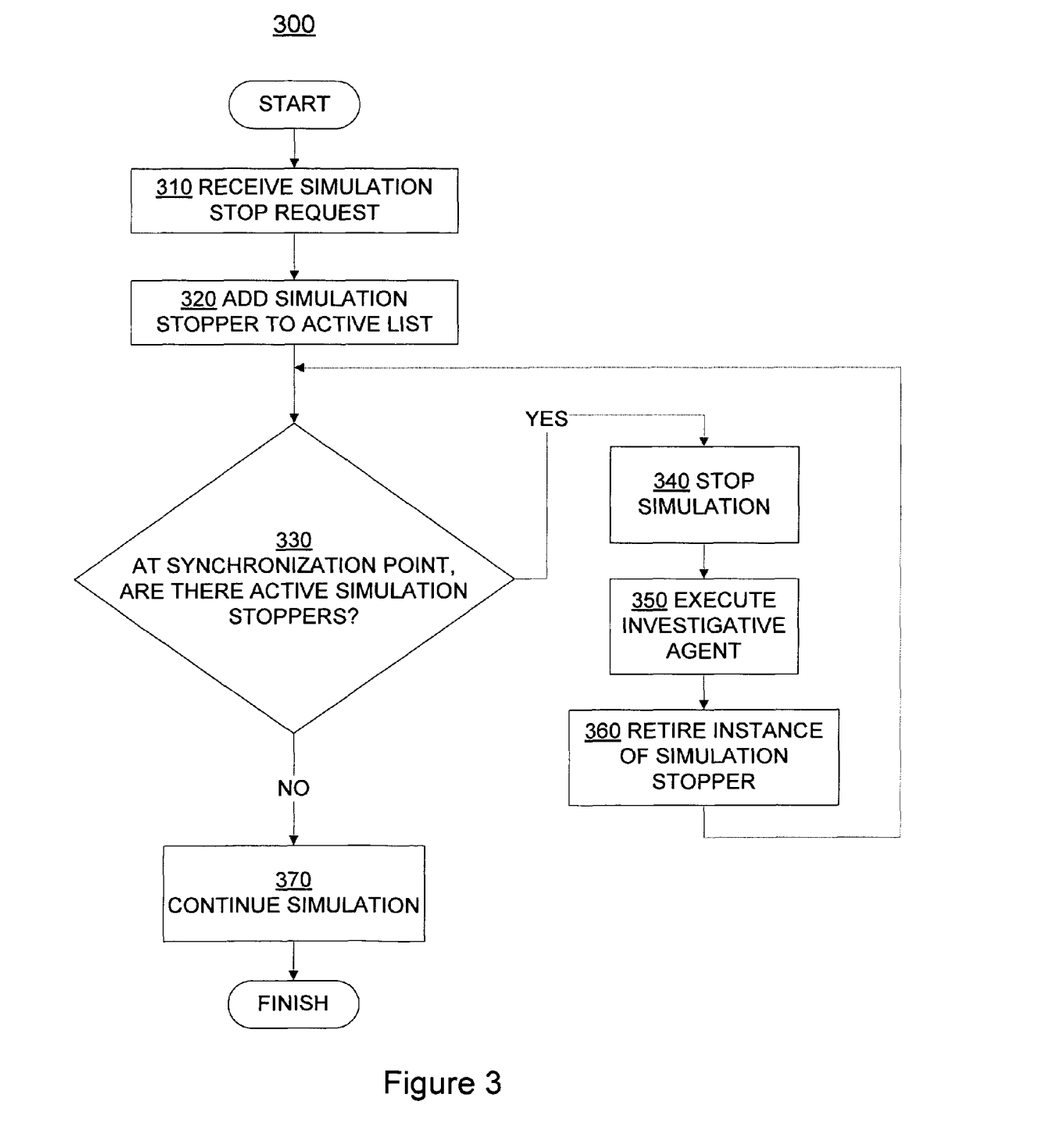
FIG. 3 illustrates a flow chart for an exemplary method of stopping a simulation, in accordance with embodiments of the present invention.

FIG. 3 illustrates a flow chart for an exemplary method 300 of stopping a simulation, in accordance with embodiments of the present invention. In optional 310, a simulation stop request, e.g., simulation stop request 215 (FIG. 2) is received from an investigative agent, e.g., debugger software 210, by a simulation stopper software, e.g., simulation stopper software 220 (FIG. 2). It is appreciated that investigative agents may be utilized with non-processor hardware.

In optional 320, the simulation stopper software corresponding to the simulation stop request, e.g., simulation stopper software 220 (FIG. 2), is added to a list of active simulation stopper software maintained in a computer usable media, e.g., on computer system 100 (FIG. 1). It is appreciated that a simulation stopper software may receive multiple simulation stop requests, and that a simulation stopper should be added to the list of active simulation stopper software for each simulation stop request. Consequently, a particular simulation stopper software may be listed multiple times in the list of active simulation stopper software, corresponding to such multiple simulation stop requests.

It is to be appreciated that 310 and 320 may execute during simulation, and may further execute multiple times, corresponding to multiple simulation stop requests. 310 and 320 generally, but not necessarily exclusively, are responsive to exceptions. For example, hitting a breakpoint in a simulation may trigger execution of 310 and 320.

In 330, the list of active simulation stopper software is queried to determine if there are any active simulation stop requests. If there are active requests, control is transferred to 340. If there are no active requests, control is transferred to 370 and simulation continues.

It is to be appreciated that, in accordance with embodiments of the present invention, 330 occurs only at a point during a simulation in which all simulated states are synchronized. Such points generally occur at the beginning of a simulation loop, e.g., before a cycle of simulation has occurred, as well as at the end of a simulation loop, e.g., after a cycle of simulation has occurred, and prior to any subsequent simulation. It is to be appreciated that there may be other such points of synchronization among various simulation systems, and all such points of synchronization are considered within the scope of the present invention.

In optional 340, responsive to at least one active simulation stopper, simulation is stopped, e.g., via a stop signal from simulation run control software 230 to the hardware simulation 240 as illustrated in FIG. 2.

In optional 350, an investigative agent is executed. Investigative agents may include software operating on an instruction set simulator as well as hardware state investigative agents that do not correspond to simulated software, for example.

In optional 360, an instance of the simulation stopper corresponding to the present stoppage of simulation is retired or removed from the list of active simulation stopper software. It is appreciated that additional instances of the simulation stopper may remain on the list of active simulation stopper software, corresponding to other simulation stop requests received from investigative agents, including debugger software.

After completion of 360, typically in the form of a user instruction to continue the simulation, control passes back to 330. It is appreciated that the list of active simulation stopper software may still list active simulation stoppers. In such a situation, 330 will transfer control back to 340, and so on. If the list of active simulation stopper software does not indicate any active simulation stoppers, control will pass to 370.

In optional 370, the simulation is continued.

In this novel manner, a simulation is only stopped at a point in the simulation at which all simulated hardware states are synchronized. As a beneficial result, the interaction of multiple hardware modules, including, e.g., multiple processors, may be accurately and effectively examined by designers.

Figure 4:
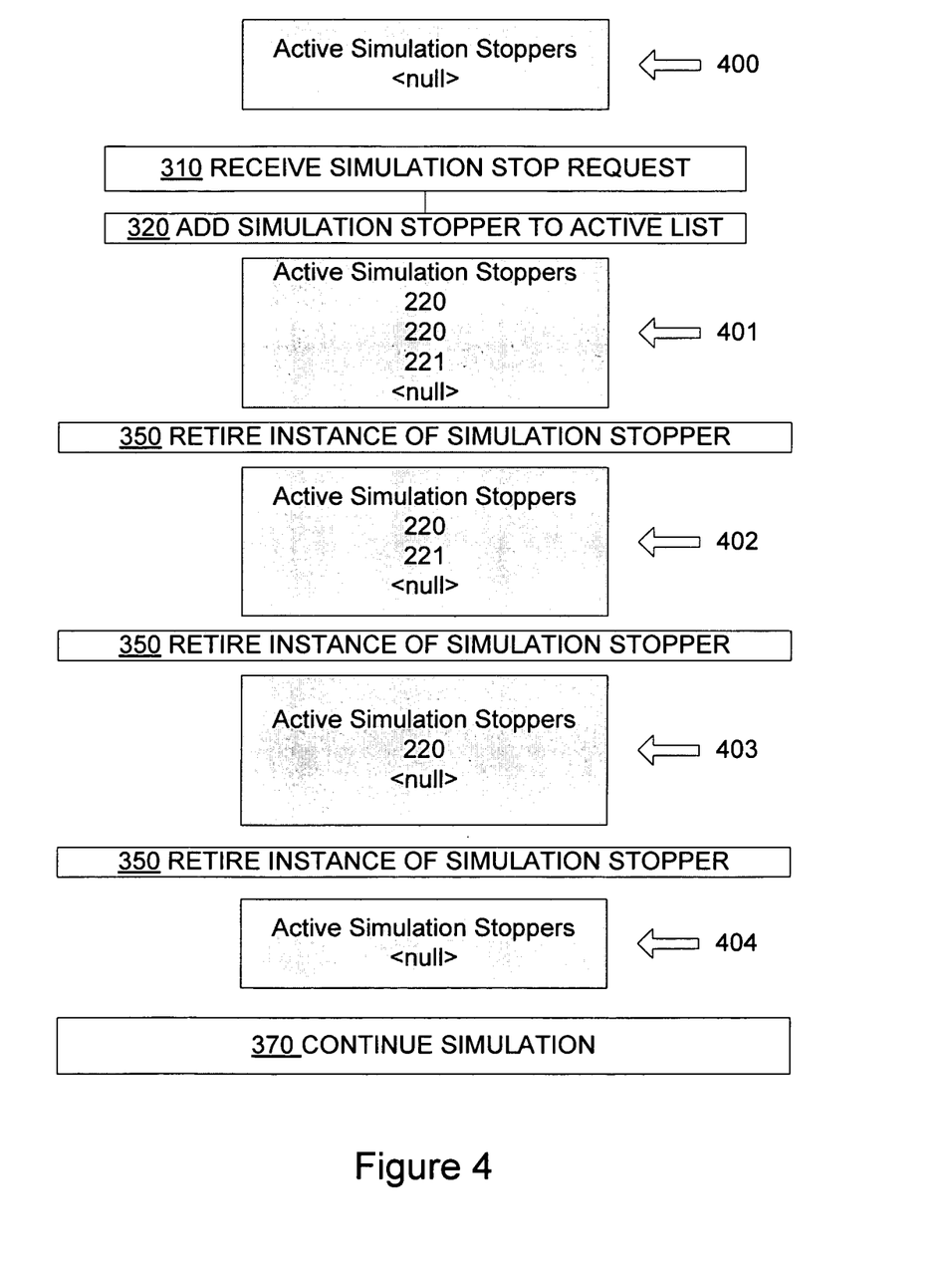
FIG. 4 illustrates an exemplary embodiment of a data structure comprising a list of active simulation stopper software, in accordance with embodiments of the present invention.

FIG. 4 illustrates an exemplary embodiment of a data structure comprising a list of active simulation stopper software, in accordance with embodiments of the present invention. In FIG. 4, several states, 400 through 404, of list of active simulation stopper software are illustrated, interleaved with elements of exemplary method of stopping a simulation 300.

In FIG. 4, state 400 illustrates an initial empty state of a list of active simulation stopper software. Responsive to a simulation stopper software, e.g., simulation stopper software 220 (FIG. 2), generating a request to suspend or stop simulation, a simulation run control software, e.g., simulation run control software 230 (FIG. 2), receives a simulation stop request, e.g., at 310 of FIG. 3. Responsive to such receipt, the corresponding simulation stopper software is added to the list of active simulation stopper software.

It is appreciated that multiple simulation stopper software may request stoppage of a simulation. In accordance with alternative embodiments of the present invention, a single simulation stopper software may correspond to a single stop request. In FIG. 4, State 401 of list of active simulation stopper software illustrates a list of active simulation stopper software as a result of three simulation stop requests. As illustrated, two requests correspond to simulation stopper software 220 (FIG. 2) and one request corresponds to simulation stopper software 221 (FIG. 2).

At a point of simulation synchronization, the list of active simulation stopper software is queried, e.g., as in 330 of FIG. 3. As state 401 of list of active simulation stopper software is not empty, simulation is stopped. Typically, an investigative agent will be executed. In addition, an instance of the simulation stopper software corresponding to the instant simulation stoppage will be retired. For example, the segment 340, 350, 360 of FIG. 3 is executed. State 402 of list of active simulation stopper software illustrates a retirement of one instance of simulation stopper 220.

As the list of active simulation stopper software is not empty, e.g., the list contains at least one item in state 402, simulation does not resume. Rather, an investigative agent will be executed and an instance of the simulation stopper software corresponding to the instant simulation stoppage will be retired. State 403 of list of active simulation stopper software illustrates a retirement of one instance of simulation stopper 221.

This process, e.g., execution of 330, 340, 350 and 360 of FIG. 3, continues until the list of active simulation stopper software is empty, for example the list has not entries, e.g., as illustrated by state 404. Responsive to an empty list of active simulation stopper software, simulation may continue, as in 370.

An embodiment in accordance with the present invention is now described with respect to implementation in SystemC. SystemC is a well known, widely used system description language used for hardware simulation. SystemC is described in Institute of Electrical and Electronics Engineers (IEEE) standard 1666, which is incorporated herein by reference in its entirety as background material. It is appreciated, however, that embodiments in accordance with the present invention are well suited to other simulation environments, e.g., very high speed integrated circuit hardware description language (VHDL) or Verilog, and that such embodiments will be apparent to those skilled in the art.

Within a SystemC simulation environment, each instruction set simulator runs in a SystemC module with its own SystemC thread. The SystemC thread executes an instruction loop for simulating the model instructions. With each cycle of the loop the ISS executes a part of one or multiple target instructions and synchronizes the SystemC time of the module by a call to the SystemC function "sc_wait( . . . )." For stopping the ISS at a breakpoint with help of the simulation run control, the ISS should use one instance of a simulation stopper. The instruction loop of the ISS is extended by two steps.

After the synchronization of the module by calling the SystemC function sc_wait(synchronization_event), e.g., at the beginning of a new simulation loop cycle, the ISS checks to determine if there is a reason to stop the core. Possible reasons include, e.g., a breakpoint hit at the instruction to be executed in the upcoming loop cycle or a request from an attached debugger to stop the ISS. If there is a reason to stop the ISS, the ISS requests stoppage of the simulation by activating its simulation stopper. It is appreciated that this step is executed during the first delta cycle after the time advance of the SystemC time.

Subsequently, an additional delta cycle wait, sc_wait(0) is executed.

It is appreciated that all instruction set simulators execute the instruction after the newly inserted first delta cycle. For example, instructions of any ISS that allow attachment of a debugger are executed beginning with a second or following delta cycle.

Thus, in accordance with embodiments of the present invention, a SystemC simulation is stopped at a point during execution at which all modules of the SystemC model are synchronized. For example, simulation is stopped at a point during execution at which all behavior code of all modules belonging to a given delta cycle have been executed. If a simulation is stopped for the purpose of investigating the state of an ISS the exact SystemC time when the simulation stops is determined in such a way that an instruction set simulator is enabled to request stopping of the SystemC simulation at the beginning of the clock cycle that executes an instruction with a breakpoint.

In addition, a plurality of instruction set simulators are enabled to stop the SystemC simulation at the same SystemC time. Advantageously, multiple debugger applications can then control the ISS in a multi core SystemC simulation.

Embodiments in accordance with the present invention provide a system and method for stopping integrated circuit simulation. Embodiments in accordance with the present invention also provide for systems and methods for stopping integrated circuit simulation that stop a simulation in a consistent state for all simulated modules. Further, embodiments in accordance with the present invention provide for systems and methods for stopping integrated circuit simulation that are compatible and complementary with existing systems and methods of hardware and processor simulation.

Various embodiments of the invention, system and method for stopping integrated circuit simulation, are thus described. While the present invention has been described in particular embodiments, it should be appreciated that the invention should not be construed as limited by such embodiments, but rather construed according to the below claims.

What is claimed is:

1. A method for debugging an electronic hardware design, the electronic hardware design comprising a plurality of simulated hardware modules configured to operate in parallel and having a simulated state, the method comprising:

receiving, during execution of a simulation of the simulated hardware modules, a plurality of simulation stop requests requesting stoppage of the simulation from a plurality of simulation stoppers associated with a plurality of debuggers for the simulated hardware modules, the simulation stop requests including a first simulation stop request corresponding to a first simulated hardware module and generated in response to hitting of a breakpoint during execution of the simulation, the simulation stop requests including a second simulated stop request corresponding to a second simulated hardware module and generated during execution of the simulation;

responsive to receiving the simulation stop requests including the first simulation stop request and the second simulation stop request, creating a plurality of active simulation stopper entries for the plurality of simulation stoppers in a list of active simulation stoppers;

reaching a synchronization point of the simulation that is subsequent to the simulation stop requests, the simulated state of the simulation hardware modules being synchronized at the synchronization point;

at the synchronization point of the simulation, stopping the simulation and repeatedly performing the following steps until the list of active simulation stoppers is empty:
  executing a corresponding investigative agent for the corresponding active simulation stopper entry;
  removing the corresponding active simulation stopper entry from the list of active simulation stoppers; and continuing the simulation responsive to the list of active simulation stoppers being empty.

2. The method of claim 1, wherein the simulated hardware modules are simulated processors.

3. The method of claim 1, wherein the simulation stop requests are received by a central application software controlling starting and stopping of said simulation.

4. The method of claim 1, wherein the simulation is a SystemC simulation.

5. The method of claim 1, wherein the synchronization point is a delta cycle.

6. The method of claim 1, wherein the synchronization point is a sc_wait function.

7. The method of claim 1, wherein the simulation is a sequential simulation of the plurality of simulated hardware modules and the simulation is an instruction set simulation.

8. The method of claim 1, wherein the synchronization point is at a beginning of a simulation cycle.

9. The method of claim 1, wherein the steps performed at the synchronization point of the simulation comprise:
  executing a first investigative agent for a first active simulation stopper entry from the list of active simulation stoppers;
  removing the first active simulation stopper entry from the list of active simulation stoppers;
  executing a second investigative agent for a second active simulation stopper entry from the list of active simulation stoppers; and
  removing the second active simulation stopper entry from the list of active simulation stoppers.

10. The method of claim 1, the simulation stop requests include a third simulation stop request corresponding to the second simulated hardware module and generated during execution of the simulation.

11. An article of manufacture comprising a non-transitory computer usable media comprising computer usable instructions that, responsive to execution on a computer processor, causes the computer processor to perform operations comprising:
  receiving, during execution of a simulation of the simulated hardware modules, a plurality of simulation stop requests requesting stoppage of the simulation from a plurality of simulation stoppers associated with a plurality of debuggers for the simulated hardware modules, the simulation stop requests including a first simulation stop request corresponding to a first simulated hardware module and generated in response to hitting of a breakpoint during execution of the simulation, the simulation stop requests including a second simulated stop request corresponding to a second simulated hardware module and generated during execution of the simulation;
  responsive to receiving the simulation stop requests including the first simulation stop request and the second simulation stop request, creating a plurality of active simulation stopper entries for the plurality of simulation stoppers in a list of active simulation stoppers;
  reaching a synchronization point of the simulation that is subsequent to the simulation stop requests, the simulated state of the simulation hardware modules being synchronized at the synchronization point;
  at the synchronization point of the simulation, stopping the simulation and repeatedly performing the following steps until the list of active simulation stoppers is empty:
    executing a corresponding investigative agent for the corresponding active simulation stopper entry;
    removing the corresponding active simulation stopper entry from the list of active simulation stoppers; and
  continuing the simulation responsive to the list of active simulation stoppers being empty.

12. The article of manufacture of claim 11, wherein the simulated hardware modules are simulated processors.

13. The article of manufacture of claim 11, wherein the simulation stop requests are received by a central application software controlling starting and stopping of said simulation.

14. The article of manufacture of claim 11, wherein the simulation is a SystemC simulation.

15. The article of manufacture of claim 11, wherein the synchronization point is a delta cycle.

16. The article of manufacture of claim 11, wherein the synchronization point is a sc_wait function.

17. The article of manufacture of claim 11, wherein the simulation is a sequential simulation of the plurality of simulated hardware modules and the simulation is an instruction set simulation.

18. The article of manufacture of claim 11, wherein the synchronization point is at a beginning of a simulation cycle.

19. The article of manufacture of claim 11, wherein the steps performed at the synchronization point of the simulation comprise:
  executing a first investigative agent for a first active simulation stopper entry from the list of active simulation stoppers;
  removing the first active simulation stopper entry from the list of active simulation stoppers;
  executing a second investigative agent for a second active simulation stopper entry from the list of active simulation stoppers; and
  removing the second active simulation stopper entry from the list of active simulation stoppers.

20. The article of manufacture of claim 11, wherein the simulation stop requests include a third simulation stop request corresponding to the second simulated hardware module and generated during execution of the simulation.

* * * * *